(12) United States Patent
Cha

(10) Patent No.: US 9,786,374 B2
(45) Date of Patent: Oct. 10, 2017

(54) NONVOLATILE MEMORY DEVICE, OPERATING METHOD THEREOF, AND TEST SYSTEM FOR OPTIMIZING ERASE LOOP OPERATIONS

(71) Applicant: SK hynix Inc., Icheon-si, Gyeonggi-do (KR)

(72) Inventor: Jae Won Cha, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/722,796

(22) Filed: May 27, 2015

(65) Prior Publication Data

US 2016/0276033 A1 Sep. 22, 2016

(30) Foreign Application Priority Data

Mar. 19, 2015 (KR) ........................ 10-2015-0038209

(51) Int. Cl.
| | | |
|---|---|---|
| *G11C 16/16* | (2006.01) | |
| *G11C 16/14* | (2006.01) | |
| *G11C 29/50* | (2006.01) | |
| *G11C 16/34* | (2006.01) | |
| *G11C 29/02* | (2006.01) | |
| *G11C 29/04* | (2006.01) | |

(52) U.S. Cl.
CPC ............. *G11C 16/16* (2013.01); *G11C 16/14* (2013.01); *G11C 16/349* (2013.01); *G11C 29/021* (2013.01); *G11C 29/028* (2013.01); *G11C 29/50* (2013.01); *G11C 29/50004* (2013.01); *G11C 2029/0409* (2013.01)

(58) Field of Classification Search
CPC .......... G11C 16/16; G11C 16/14; G11C 29/50
USPC ....................................... 365/185.29, 185.22
See application file for complete search history.

(56) References Cited

U.S. PATENT DOCUMENTS

| | | | | |
|---|---|---|---|---|
| 9,070,481 B1* | 6/2015 | Ellis | ..................... | G11C 29/50 |
| 2008/0144396 A1* | 6/2008 | Chang | ................... | G11C 16/16 |
| | | | | 365/185.33 |
| 2008/0239828 A1* | 10/2008 | Lee | .................... | G11C 16/0483 |
| | | | | 365/185.29 |
| 2012/0213005 A1* | 8/2012 | Lee | ........................ | G11C 16/14 |
| | | | | 365/185.11 |
| 2014/0043914 A1* | 2/2014 | Shim | ..................... | G11C 16/14 |
| | | | | 365/185.22 |

FOREIGN PATENT DOCUMENTS

KR 1020120098164 A 9/2012

* cited by examiner

*Primary Examiner* — Richard Elms
*Assistant Examiner* — Jerome Leboeuf
(74) *Attorney, Agent, or Firm* — William Park & Associates Ltd.

(57) ABSTRACT

A nonvolatile memory device includes a plurality of memory blocks. The nonvolatile memory device includes a controller configured to perform an erase operation by repeating an erase loop, and generates and stores a test result based on a pass erase loop count of the erase operation in response to a result processing command. The erase loop includes applying an erase voltage to a target memory block among the memory blocks in response to an erase command.

18 Claims, 8 Drawing Sheets

US 9,786,374 B2

NONVOLATILE MEMORY DEVICE, OPERATING METHOD THEREOF, AND TEST SYSTEM FOR OPTIMIZING ERASE LOOP OPERATIONS

CROSS-REFERENCES TO RELATED APPLICATION

The present application claims priority under 35 U.S.C. §119(a) to Korean application number 10-2015-0038209, filed on Mar. 19, 2015, in the Korean Intellectual Property Office, which is incorporated herein by reference in its entirety.

BACKGROUND

1. Technical Field

Various embodiments generally relate to a memory device, and more particularly, to a method for setting the level of an erase voltage used for an erase operation of a nonvolatile memory device.

2. Related Art

A semiconductor memory device may be used to store data. Semiconductor memory devices may be divided into nonvolatile and volatile memory devices.

The nonvolatile memory devices maintain data stored therein even though power to the nonvolatile memory device is cut off. The nonvolatile memory devices include flash memory devices such as NAND flash or NOR flash, Ferro-electrics Random Access Memory (FeRAM), or Phase-Change Random Access Memory (PCRAM). The nonvolatile memory devices may include Magnetoresistive Random Access Memory (MRAM) or Resistive Random Access Memory (ReRAM).

Volatile memory devices fail to maintain data stored therein when power to the volatile memory device is cut off. Volatile memory devices include Static Random Access Memory (SRAM) and Dynamic Random Access Memory (DRAM). Volatile memory devices, due to their relatively high processing speed, are generally used as buffer memory devices, cache memory devices, or working memory devices in data processing systems.

SUMMARY

In an embodiment, there may be provided a nonvolatile memory device. The nonvolatile memory device may include a plurality of memory blocks. The nonvolatile memory device may include a controller configured to perform an erase operation by repeating an erase loop, and may generate and store a test result based on a pass erase loop count of the erase operation in response to a result processing command. The erase loop may include applying an erase voltage to a target memory block among the memory blocks in response to an erase command.

In an embodiment, there may be provided an operating method of a nonvolatile memory device. The operating method of a nonvolatile memory device may include performing an erase operation by repeating an erase loop for a target memory block among a plurality of memory blocks, in response to an erase command. The operating method of a nonvolatile memory device may include generating a test result based on a pass erase loop count of the erase operation, in response to a result processing command. The operating method of a nonvolatile memory device may include setting a start level of an erase voltage applied to the target memory block based on the test result, in response to a start level setting command.

In an embodiment, there may be provided a test system. The test system may include a test device configured to generate an erase command and a result processing command. The test system may include a nonvolatile memory device. The nonvolatile memory device may include a plurality of memory blocks. The nonvolatile memory device may include a controller configured to perform an erase operation by repeating an erase loop, and may generate and store a test result based on a pass erase loop count of the erase operation in response to the result processing command. The erase loop may include applying an erase voltage to a target memory block among the memory blocks in response to the erase command.

DETAILED DESCRIPTION

Figure 1:
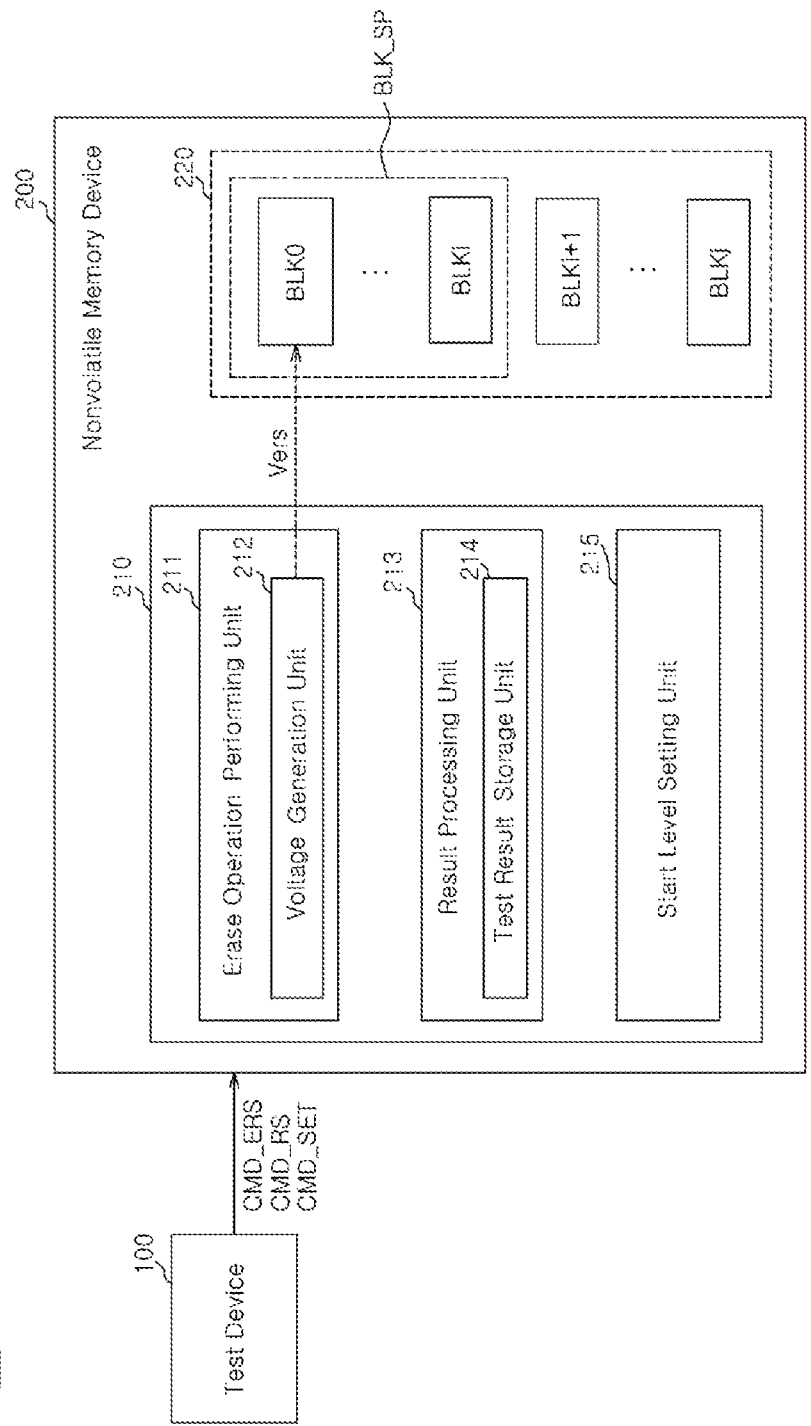
FIG. 1 is a block diagram illustrating a representation of an example of a test system according to an embodiment.

Hereinafter, a data storage device and an operating method thereof will be described with reference to the accompanying drawings through various examples of embodiments. The embodiments may, however, be embodied in different forms and should not be construed as being limited to the various embodiments set forth herein.

It is to be understood that the embodiments are not limited to the particulars illustrated in the drawings, that the drawings are not necessarily to scale, and, in some instances, proportions may have been exaggerated in order to more clearly depict certain features. While particular terminology is used, it is to be appreciated that the terminology used is for describing particular embodiments only and is not intended to limit the scope.

FIG. 1 is a block diagram illustrating a representation of an example of a test system 10 according to an embodiment.

The test system 10 may include a test device 100 and a nonvolatile memory device 200.

The test device 100 may generate an erase command CMD_ERS. The test device 100 may transmit the generated erase command CMD_ERS to the nonvolatile memory device 200. The erase command CMD_ERS may instruct the nonvolatile memory device 200 to erase a target memory block among a plurality of memory blocks BLK0 to BLKj included in the nonvolatile memory device 200. FIG. 1 illustrates the example in which the target memory block is the first memory block BLK0, for example. When an erase operation for the target memory block is completed, the test device 100 may transmit a result processing command CMD_RS to the nonvolatile memory device 200. The result processing command CMD_RS may instruct the nonvolatile memory device 200 to generate and store a test result based on the result of the erase operation. The test device 100 may transmit the erase command CMD_ERS and the result processing command CMD_RS to each of a plurality of sample memory blocks BLK_SP included in the nonvolatile memory device 200. For example, in an effort to improve the reliability of the test result through expansion of test samples, memory blocks BLK0 to BLKi among the plurality of memory blocks BLK0 to BLKj included in the nonvolatile memory device 200 may be selected as the test samples, and then tested.

When a target test result is collected in a test result storage unit 214 of the nonvolatile memory device 200 after the test for each of the sample memory blocks BLK_SP is completed through the erase command CMD_ERS and the result process command CMD_RS of the test device 100, the test device 100 may transmit a start level setting command CMD_SET. The start level setting command CMD_SET sent by the test device 100 may instruct the nonvolatile memory device 200 to set the start level of an erase voltage Vers. The erase voltage Vers may be used when the nonvolatile memory device 200 performs an erase operation.

The nonvolatile memory device 200 may include a controller 210 and a memory cell array 220.

The memory cell array 220 may be implemented with a three-dimensional (3D) structure, for example, and include a plurality of memory cells. Each of the memory cells may store data as a floating gate is charged. The memory cell may be erased as the positive erase voltage Vers is applied to a well to discharge the floating gate.

The memory cell array 220 may include a plurality of memory blocks BLK0 to BLKj. A memory block may indicate the unit of an erase operation performed by the nonvolatile memory device 200. For example, when an erase operation is performed on a certain target memory block (for example, BLK0), the positive erase voltage Vers may be applied to a well coupled to memory cells included in the target memory block BLK0, in order to simultaneously erase the memory cells included in the target memory block BLK0.

The controller 210 may include an erase operation performing unit 211, a result processing unit 213, and a start level setting unit 215. The erase operation performing unit 211, the result processing unit 213, and the start level setting unit 215 may be implemented in hardware either separately or within the same hardware. The hardware may include a digital circuit, an analog circuit, or a combination of digital and analog circuits, for example. For example, each of the following units: erase operation performing unit 211, the result processing unit 213, and the start level setting unit 215, may be implemented in software such as firmware. For example, the erase operation performing unit 211, each result processing unit 213, and the start level setting unit 215 may be implemented as a combination of hardware and software.

The erase operation performing unit 211 may perform an erase operation by repeating an erase loop. In the erase loop the erase voltage Vers is applied to the target memory block BLK0, in response to the erase command CMD_ERS transmitted from the test device 100. The erase operation performing unit 211 may perform an erase operation on the target memory block BLK0 according to an incremental step pulse erase (ISPE) method. The ISPE will be described below with reference to FIG. 2. The erase operation performing unit 211 may include a voltage generation unit 212 for generating the erase voltage Vers. The erase operation performing unit 211 may report the completion of the erase operation to the test device 100.

The result processing unit 213 may generate and store a test result based on an erase loop number for the erase operation, in response to the result processing command CMD_RS. The result processing unit 213 may include a test result storage unit 214 for storing the test result.

In response to the start level setting command CMD_SET, the start level setting unit 215 may set the start level of the erase voltage Vers based on the test result stored in the test result storage unit 214. The start level of the erase voltage Vers may correspond to the level of the erase voltage Vers applied at the initial erase loop, when the erase loop is repeated according to the ISPE method during the erase operation.

Before the start level setting unit 215 finally sets the start level of the erase voltage Vers in response to the start level setting command CMD_SET, a certain initial level may be already set to the start level of the erase voltage Vers. For example, when performing the initial erase loop during the erase operation of the test, the erase operation performing unit 211 may apply an erase voltage Vers having the initial level to the target memory block. After the start level setting unit 215 finally sets the start level of the erase voltage Vers, the erase operation performing unit 211 may apply an erase voltage Vers having the set start level to the target memory block, when performing the initial erase loop during an erase operation.

In the conventional test system, the test device must directly set the start level of an erase voltage to be used when an erase operation of the nonvolatile memory device is performed. For the erase operation of the conventional test system, the test device must transmit a large number of commands to the nonvolatile memory device, in order to instruct the nonvolatile memory device to perform test operations on the respective sample memory blocks. According to the embodiments and referring back to FIG. 1, however, the test device 100 may transmit only the erase command CMD_ERS, the result processing command CMD_RS, and the start level setting command CMD_SET to the nonvolatile memory device 200. For example, the nonvolatile memory device 200 may perform a test through a preset erase algorithm and generate a test result in response to the commands. The nonvolatile memory device 200 may autonomously set the start level of the erase voltage Vers through a simple algorithm. For example, the load of the test device 100 can be considerably reduced.

Figure 2:
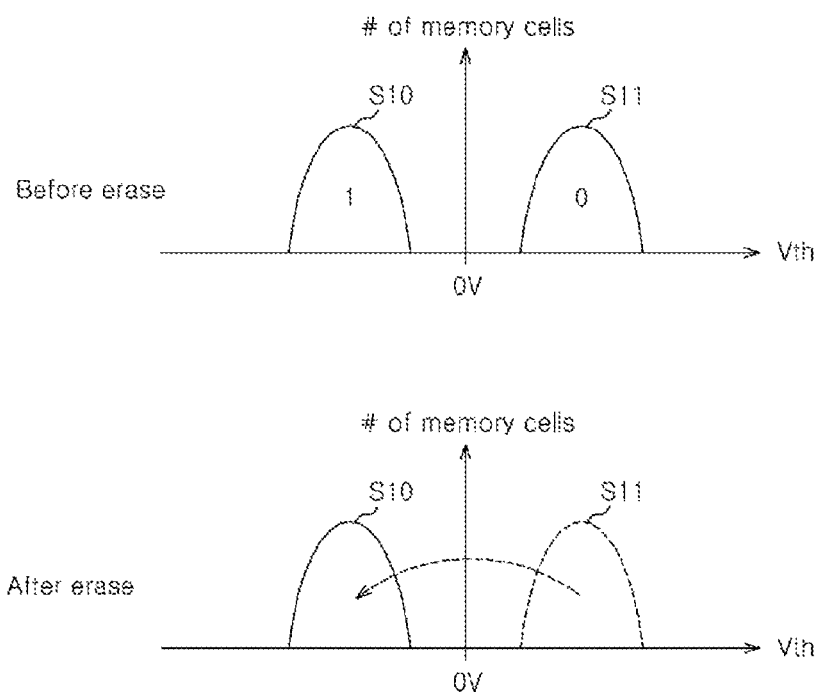
FIG. 2 is a diagram illustrating a representation of an example of a shift of threshold voltage distribution of memory cells included in a target memory block, before and after an erase operation is performed.

FIG. 2 is a diagram illustrating a representation of an example of a shift of threshold voltage distribution of memory cells included in the target memory block, before and after an erase operation is performed. Referring to the graph of FIG. 2, the horizontal axis indicates the threshold voltage Vth, and the vertical axis indicates the number of memory cells.

The memory cells included in the target memory block may form a predetermined threshold voltage distribution according to data stored therein. For example, when one-bit data is stored in each memory cell, memory cells storing data of "0" may form a threshold voltage distribution S11, and memory cells storing data of "1" may form a threshold voltage distribution S10.

When the target memory block is completely erased, the threshold voltages Vth of the memory cells having formed the threshold voltage distribution S11 may be changed. Then, the memory cells may form the threshold voltage distribution S10. Thus, erase verification, that is, verification for whether the target memory block was completely erased may be performed by determining whether the threshold voltages Vth of the memory cells correspond to the threshold voltage distribution S10. For other examples, since "1" is stored as erase data in all of the memory cells when the target memory block is completely erased, the erase verification may be performed by reading the data stored in the memory cells and determining whether "1" is stored in the memory cells.

Figure 3:
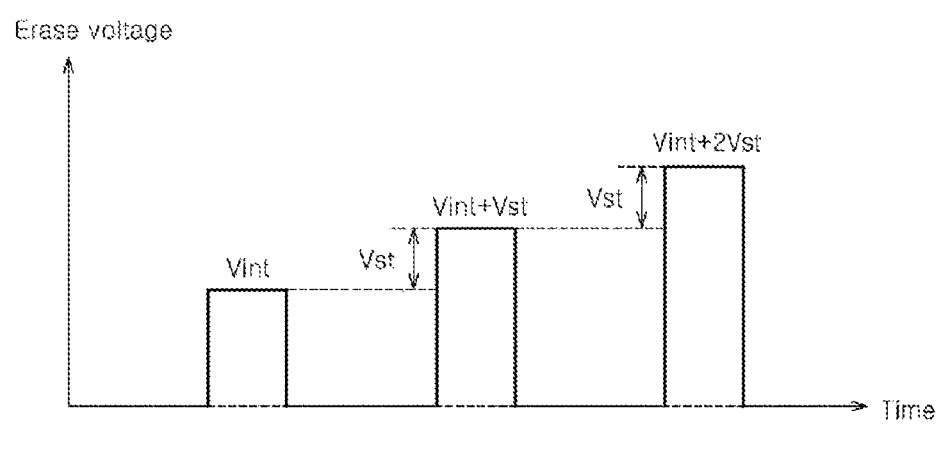
FIG. 3 is a diagram illustrating a representation of an example of an erase voltage applied to the target memory block when an erase operation performing unit of FIG. 1 performs an erase operation.

FIG. 3 is a diagram illustrating a representation of an example of an erase voltage Vers applied to the target memory block when the erase operation performing unit 211 of FIG. 1 performs an erase operation.

The erase operation performing unit 211 may perform an erase operation by repeating an erase loop according to the ISPE method. One erase loop may include an operation of applying the erase voltage Vers to a target memory block and an erase verification operation. The erase loop number may indicate the number of erase loops repetitively performed. The erase operation performing unit 211 may raise the level of the erase voltage Vers by a predetermined step level Vst from the level applied at the immediately previous erase loop, whenever the erase loop is repeated.

For example, referring to FIG. 3, the erase operation performing unit 211 may apply the erase voltage Vers having the predetermined initial level Vint to the target memory block at the first erase loop, that is, when the erase loop number is 1. Then, the erase operation performing unit 211 may perform an erase verification operation on the target memory block.

When, for example, the target memory block is not completely erased at the first erase loop, the erase operation performing unit 211 may start a second erase loop. At the second erase loop, that is, when the erase loop number is 2, the erase operation performing unit 211 may raise the level of the erase voltage Vers by the step level Vst from the initial level Vint, and apply the erase voltage Vers having the raised level Vint+Vst to the target memory block. Then, the erase operation performing unit 211 may perform an erase verification operation on the target memory block.

When, for example, the target memory block is not completely erased at the second erase loop, the erase operation performing unit 211 may start a third erase loop. At the third erase loop, that is, when the erase loop number is 3, the erase operation performing unit 211 may raise the level of the erase voltage Vers by the step level Vst from the level Vint+Vst of the erase voltage Vers applied at the second erase loop, and apply the erase voltage Vers having the raised level Vint+2*Vst to the target memory block. Then, the erase operation performing unit 211 may perform an erase verification operation on the target memory block.

When, for example, the target memory block is completely erased at the third erase loop, the erase operation performing unit 211 may end the erase operation. At this time, a pass erase loop count may indicate the total number of erase loops repetitively performed until the erase verification result is a pass. The pass erase loop count may indicate a minimum number of erase loops which are to be performed until the target memory block is completely erased. Furthermore, a pass level corresponding to the pass erase loop count may indicate the level of the erase voltage Vers applied when the erase loop is repeated by the pass erase loop count. For example, in FIG. 3, the pass erase loop count for the target memory block may be set to 3, and the pass level of the erase voltage Vers may be set to Vint+2*Vst.

Figure 4:
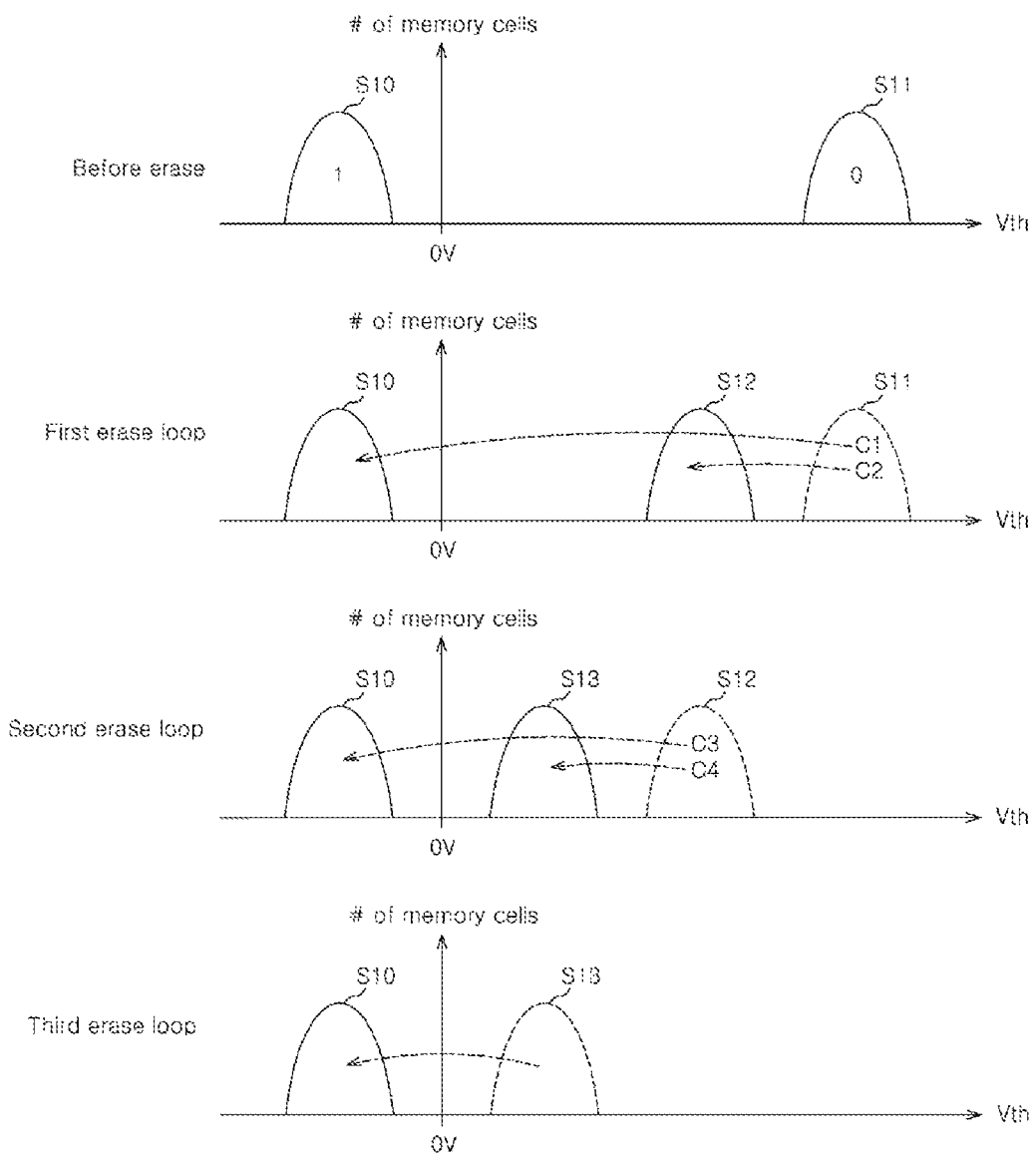
FIG. 4 is a diagram illustrating a representation of an example of a shift of threshold voltage distribution of memory cells included in a target memory block on which an erase operation is performed according to an incremental step pulse erase (ISPE) method.

FIG. 4 is a diagram illustrating a representation of an example of a shift of threshold voltage distribution of memory cells included in a target memory block on which an erase operation is performed according to the ISPE method. Referring to the graphs of FIG. 4, the horizontal axis indicates the threshold voltage Vth, and the vertical axis indicates the number of memory cells. Referring to FIG. 4, suppose that the target memory block is completely erased as the erase loop is repeated three times.

The threshold voltage distribution of the memory cells included in the target memory block may be gradually shifted toward the threshold voltage distribution S10 from the threshold voltage distribution S11, whenever the erase loop is repetitively performed.

When, for example, the first erase loop is performed, fast memory cells C1 among the memory cells forming the threshold voltage distribution S11 may be completely erased only through the erase voltage Vers having the initial level Vint, and form the threshold voltage distribution S10. However, the threshold voltages Vth of slow memory cells C2 among the memory cells forming the threshold voltage distribution S11 may not be changed to the level for forming the threshold voltage distribution S10 only through the erase voltage Vers having the initial level Vint. In this example, the slow memory cells C2 may not be completely erased, but form a threshold voltage distribution S12.

When, for example, the second erase loop is performed, the erase voltage Vers may be applied at the level Vint+Vst which is raised by the step level Vst from the initial level Vint of the erase voltage Vers applied at the first erase loop. Thus, fast memory cells C3 among the memory cells forming the threshold voltage distribution S12 may be completely erased, and form the threshold voltage distribution S10. However, slow memory cells C4 among the memory cells forming the threshold voltage distribution S11 may not be completely erased, but form a threshold voltage distribution S13.

When, for example, the third erase loop is performed, the erase voltage Vers may be applied at the level Vint+2*Vst which is raised by the step level Vst from the level Vint+Vst of the erase voltage Vers applied at the second erase loop. Thus, the memory cells forming the threshold voltage distribution S13 may be completely erased, and form the threshold voltage distribution S10.

Depending on embodiments, the nonvolatile memory device 200 may have a limit to the erase loop number, when performing the erase operation. For example, when the erase loop number reaches a critical number after the erase loop is repetitively performed, the nonvolatile memory device 200 may end the erase operation even though the target memory block was not completely erased, and may determine the erase operation for the target memory block as a fail.

Figure 5:
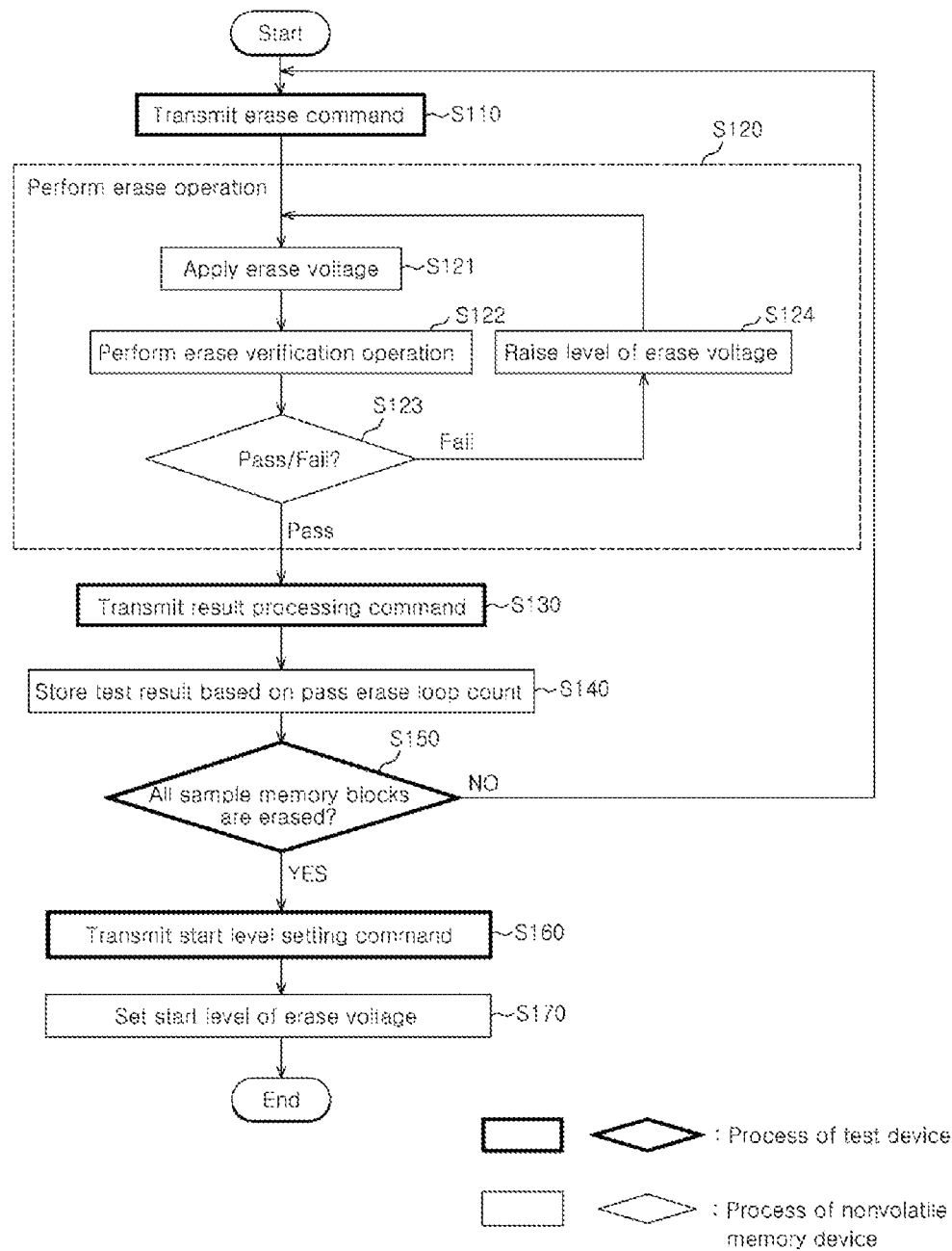
FIG. 5 is a flowchart for describing a representation of an example of an operating method of the data system of FIG. 1.

FIG. 5 is a flowchart for describing a representation of an example of an operating method of the test system 10 of FIG. 1.

At step S110 (i.e., transmit erase command), the test device 100 may transmit an erase command CMD_ERS to the nonvolatile memory device 200, the erase command CMD_ERS instructing the nonvolatile memory device 200 to erase a target memory block among sample memory blocks BLK_SP.

At step S120 (i.e., perform erase operation), the erase operation performing unit 211 may perform an erase operation on the target memory block, in response to the erase command CMD_ERS transmitted from the test device 100.

For example, at step S121 (i.e., apply erase voltage), the erase operation performing unit 211 may apply an erase voltage Vers to the target memory block. The erase operation performing unit 211 may apply the erase voltage Vers having the predetermined initial level Vint to the target memory block at the first erase loop, that is, when the erase loop number is 1.

At step S122 (i.e., perform erase verification operation), the erase operation performing unit 211 may perform an erase verification operation on the target memory block.

At step S123 (i.e., pass/fail), the procedure may be performed according to the erase verification result is a pass or fail. When the verification result of the erase operation performing unit 211 is a pass, that is, when the target memory block is completely erased, the procedure may proceed to step S130. When the verification result of the erase operation performing unit 211 is a fail, that is, when the target memory block is not completely erased, the procedure may proceed to step S124.

At step S124 (i.e., raise level of erase voltage), the erase operation performing unit 211 may raise the level of the erase voltage Vers by the step level Vst from the level of the previously applied erase voltage Vers, that is, the initial level Vint. Then, at step S121, the erase operation performing unit 211 may apply the erase voltage Vers having the raised level Vint+Vst to the target memory block. For example, when the verification result of the erase operation performing unit 211 is a fail at step S123, the erase loop including step S124 of raising the erase voltage Vers, step S121 of applying the raised erase voltage Vers, and step S122 of performing the erase verification may be repeated until the verification result of the erase operation performing unit 211 is a pass.

At step S130 (i.e., transmit result processing command), the test device 100 may transmit the result processing command CMD_RS to the nonvolatile memory device 200, in order to instruct the nonvolatile memory device 200 to generate a test result.

At step S140 (i.e., store test result based on pass erase loop count), the result processing unit 213 may generate a test result based on the pass erase loop count of the erase operation performed at step S120, in response to the result processing command CMD_RS transmitted from the test device 100, and store the generated test result in the test result storage unit 214. At this time, the pass erase loop count may indicate the total number of erase loops repetitively performed until the erase verification result is a pass. The pass erase loop count may indicate a minimum number of erase loops to be performed to completely erase the target memory block. The method for generating a test result will be described below.

At step S150 (i.e., all sample memory blocks are erased?), the procedure may be performed according to whether all of the sample memory blocks BLK_SP were erased. The test device 100 may determine whether all of the sample memory blocks BLK_SP were erased. When all of the sample memory blocks are not erased, the procedure may return to step S110. For example, at step S110, the test device 100 may transmit the erase command CMD_ERS to the nonvolatile memory device 200, the erase command CMD_ERS instructing the nonvolatile memory device 200 to erase the target memory block which is not yet erased among the sample memory blocks BLK_SP. When all of the sample memory blocks BLK_SP are erased, the procedure may proceed to step S160 because all of the target test results were collected.

At step S160 (i.e., transmit start level setting command), the test device 100 may transmit a start level setting command CMD_SET to the nonvolatile memory device 200, in order to instruct the nonvolatile memory device 200 to set the start level of the erase voltage Vers.

At step S170 (i.e., set start level of erase voltage), the start level setting unit 215 may set the start level of the erase voltage Vers based on the test result, in response to the start level setting command CMD_SET transmitted from the test device 100. The method for setting the start level of the erase voltage Vers will be described below.

As will be described below, the controller 210 may generate a test result based on the pass erase loop count in various manners (S140 of FIG. 5), and set the start level of the erase voltage Vers based on the test result (S170 of FIG. 5).

Method Using Minimum Count

As described above, the controller 210 may receive the result processing command CMD_RS from the test device 100, whenever the erase operation for each of the sample memory blocks BLK_SP is completed. In response to the result processing command CMD_RS, the result processing unit 213 may newly store the current pass erase loop count as the test result, when the current pass erase loop count, that is, the pass erase loop count of the previously performed erase operation is smaller than the test result. For example, the result processing unit 213 may store the minimum count among the pass erase loop counts for the sample memory blocks BLK_SP, as the test result.

Then, when all of the sample memory blocks BLK_SP are erased, the controller 210 may receive the start level setting command CMD_SET from the test device 100. The start level setting unit 215 may set a pass level corresponding to the pass erase loop count stored as the test result, as the start level of the erase voltage Vers, in response to the start level setting command CMD_SET. The pass level corresponding to the pass erase loop count may indicate the level of the erase voltage Vers applied when the erase loop is repeated by the pass erase loop count. For example, the start level setting unit 215 may set the pass level, at which one or more of the sample memory blocks BLK_SP can be completely erased only through one erase loop, to the start level of the erase voltage Vers, instead of the initial level Vint which has been used to test the sample memory blocks BLK_SP.

| Test result (minimum count) | Start level of erase voltage |
|---|---|
| 2 | Vint + Vst |
| k | Vint + (k − 1)*Vst |

The above-described table illustrates the start level of the erase voltage Vers set according to the test result when the nonvolatile memory device 200 receives the start level setting command CMD_SET. The test result may indicate the minimum count among the pass erase loop counts for the plurality of sample memory blocks BLK_SP. For example, when the test result is 2, the result processing unit 213 may set the pass level Vint+Vst of the erase voltage Vers generated at the second erase loop to the start level of the erase voltage Vers. This may be generalized as follows. When the test result is k, the controller 210 may set the level Vint+

(k−1)*Vst of the erase voltage Vers generated at the k-th erase loop to the start level of the erase voltage Vers.

Method Using Sum and Minimum Count

The controller 210 may receive the result processing command CMD_RS from the test device 100, whenever the erase operation for each of the sample memory blocks BLK_SP is completed. The result processing unit 213 may accumulate the current pass erase loop count to a first value of the previously stored test result in response to the result processing command CMD_RS, and newly store the current pass erase loop count as a second value of the previously stored test result when the current pass erase loop count is smaller than the second value of the previously stored test result. For example, the result processing unit 213 may store the sum of the pass erase loop counts for the sample memory blocks BLK_SP as the first value of the test result, and store the minimum count among the pass erase loop counts for the sample memory blocks BLK_SP as the second value of the test result.

Then, when all of the sample memory blocks BLK_SP are erased, the controller 210 may receive the start level setting command CMD_SET from the test device 100. The controller 210 may calculate a compensation level based on the first and second values in response to the start level setting command CMD_SET, and set a level raised by the compensation level from the pass level corresponding to the second value, as the start level of the start voltage Vers.

When a difference between the first and second values of the rest result is relatively large, it may indicate that the variance of the pass erase loop counts for the sample memory blocks BLK_SP is relatively high. In this example, when the level of the erase voltage Vers corresponding to the second value, that is, the minimum count is immediately set to the start level of the erase voltage Vers, the start level of the erase voltage Vers may be set to an excessively low level. When the start level of the erase voltage Vers is excessively low, there may exist memory blocks which are not completely erased but determined as erase fails, even though the erase loop is repeated by a preset critical number for the erase loop number. Thus, in order to suppress such an example, the level raised by the compensation level from the pass level corresponding to the minimum count may be set to the start level of the erase voltage Vers.

The test level setting unit may calculate the variance based on the first and second values according to a preset compensation level calculation algorithm, and calculate a compensation level corresponding to the variance.

| Test result | | |
|---|---|---|
| First value (Sum) | Second value (Minimum count) | Start level of erase voltage |
| 10 | 2 | Vint + Vst |
| 15 | 2 | Vint + Vst + x |
| 20 | 2 | Vint + Vst + y |

The above-described table illustrates the start level of the erase voltage Vers set according to the test result when the nonvolatile memory device 200 receives the start level setting command CMD_SET. For example, the first value of the test result may indicate the sum of pass erase loop counts for five sample memory blocks, and the second value of the test result may indicate the minimum count among the pass erase loop counts for the five sample memory blocks BLK_SP.

In the above-described table, when the first value of the test result is 10 and the second value is 2, the variance of the pass erase loop counts for the five sample memory blocks BLK_SP may be set to 0, and the start level setting unit 215 may set the pass level Vint+Vst of the erase voltage Vers generated at the second erase loop to the start level of the erase voltage Vers, without using the compensation level.

In the above-described table, when the first value of the test result is 15 and the second value is 2, the variance of the pass erase loop counts for the five sample memory blocks BLK_SP may be larger than 0, and the start level setting unit 215 may set a level Vint+Vst+x raised by the compensation level x from the pass level Vint+Vst of the erase voltage Vers generated at the second erase loop to the start level of the erase voltage Vers. Furthermore, as the difference between the first and second values gradually increases, the start level setting unit 215 may set the start level of the erase voltage Vers using a larger compensation level such that the start level of the erase voltage Vers is not set to an excessively low level. For example, the compensation level y may be larger than the compensation level x.

Depending on embodiments, the result processing unit 213 may store the pass erase loop count for each of the sample memory blocks BLK_SP as the test result, when the erase operation for the sample memory blocks BLK_SP is performed. In this example, the start level setting unit 215 may calculate only the minimum count based on the stored pass erase loop counts or calculate the sum of the pass erase loop counts and the minimum count, and set the start level of the erase voltage Vers according to the above-described methods.

Figure 6:
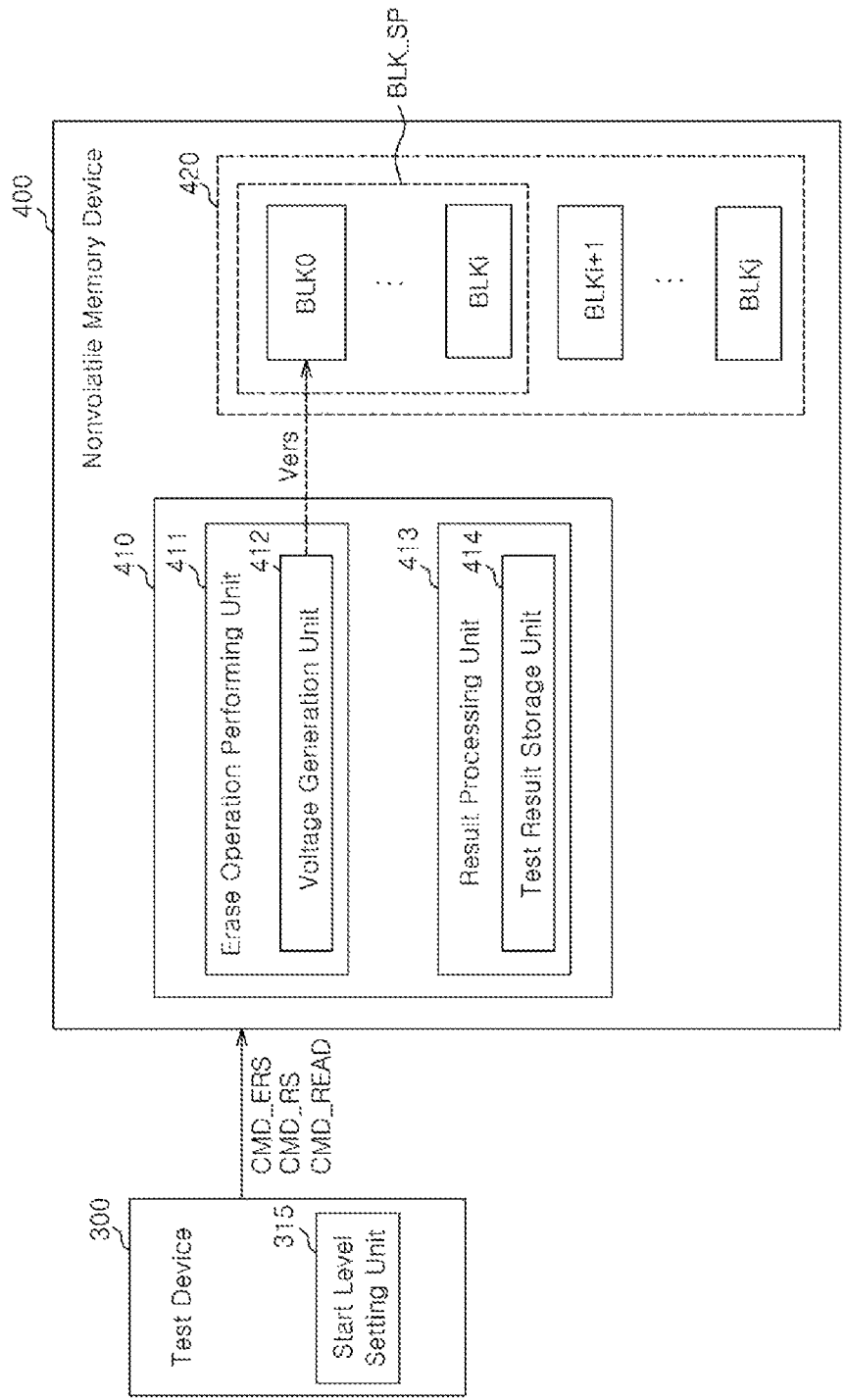
FIG. 6 is a block diagram illustrating a representation of an example of a test system according to an embodiment.

FIG. 6 is a block diagram illustrating a representation of an example of a test system 20 according to an embodiment.

The test system 20 may include a test device 300 and a nonvolatile memory device 400.

In the test system 20, the test device 300 may set the start level of an erase voltage Vers, unlike the test system 10 of FIG. 1. The test device 300 may include a start level setting unit 315. When all sample memory blocks BLK_SP are erased, the start level setting unit 315 may read a test result stored in the nonvolatile memory device 400, and set the start level of the erase voltage Vers based on the read test result. The start level setting unit 315 may transmit a test result read command CMD_READ to the nonvolatile memory device 400, in order to read the test result from the nonvolatile memory device 400. Except for the above-described configuration, the test system 20 may be configured and operated in substantially the same manner as the test system 10 of FIG. 1. Element 410 being the controller and element 420 being the memory cell array. Thus, the detailed descriptions thereof are omitted herein.

Figure 7:
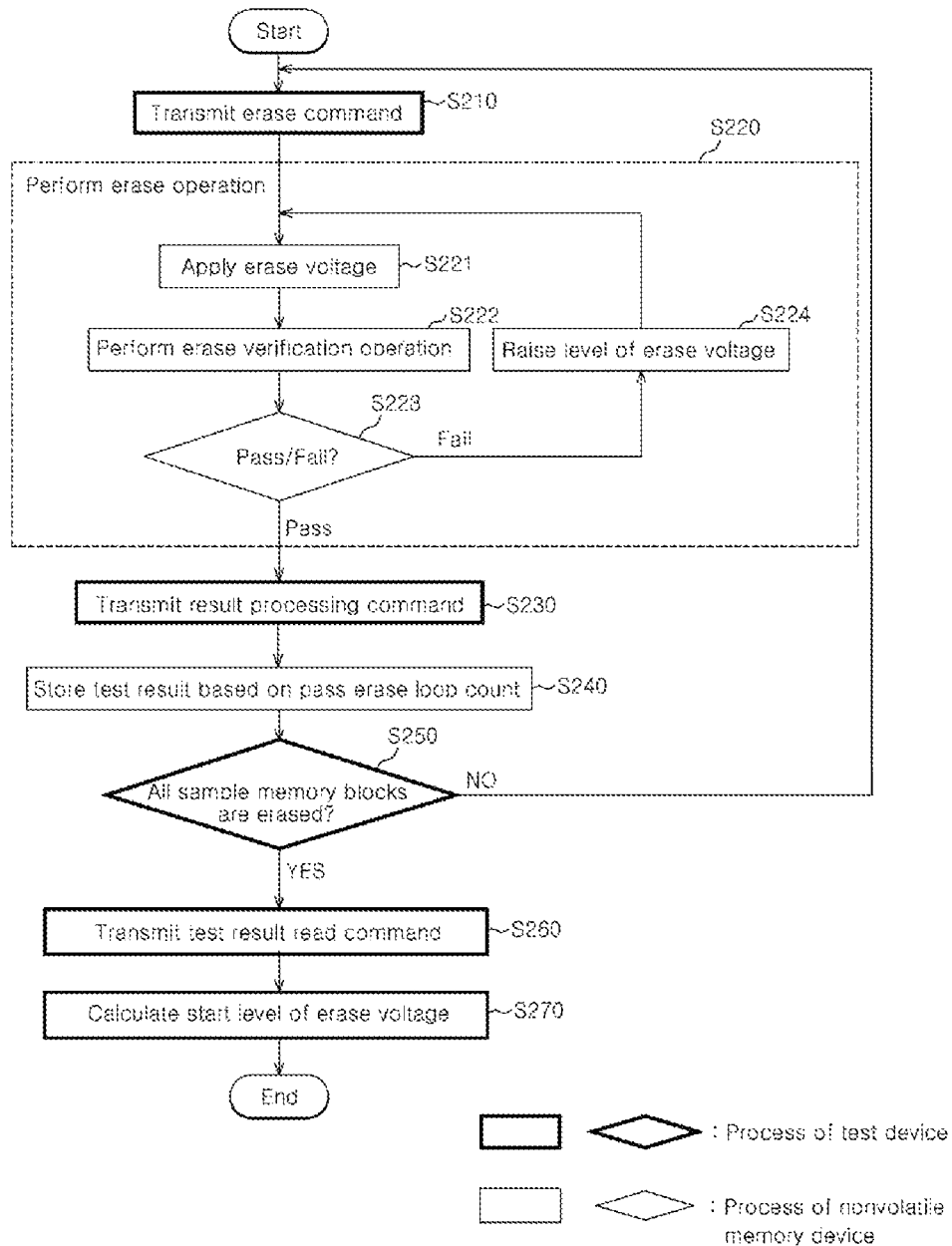
FIG. 7 is a flowchart for describing a representation of an example of an operating method of the test system of FIG. 6.

FIG. 7 is a flowchart for describing a representation of an example of an operating method of the test system 20 of FIG. 6.

In FIG. 7, steps S210 to S250 may be performed in substantially the same manner as steps S110 to S150 of FIG. 5, respectively. Thus, the following descriptions will be focused on a difference between the operating method of FIG. 7 and the operating method of FIG. 5.

At step S260 (i.e., transmit test result read command), the test device 300 may transmit a test result read command CMD_READ to the nonvolatile memory device 400.

At step S270 (i.e., calculate start level of erase voltage), the test device 300 may calculate the start level of the erase voltage Vers based on the test result read from the nonvolatile memory device 400. Then, the calculated start level of the erase voltage Vers may be stored in the nonvolatile memory device 400.

Figure 8:
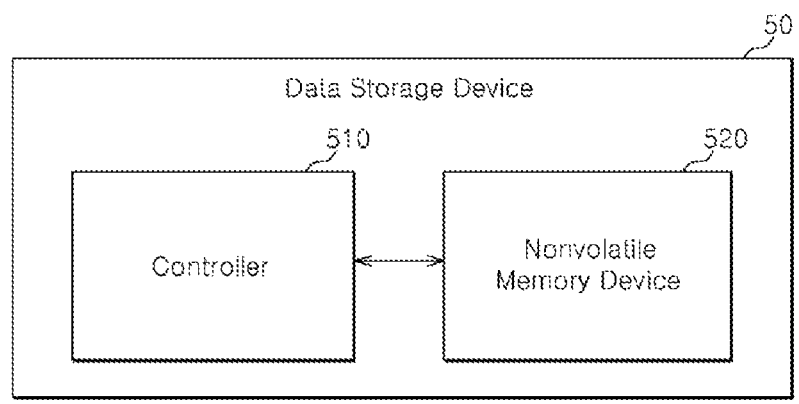
FIG. 8 is a block diagram illustrating a representation of an example of a data storage device including a nonvolatile memory device according to an embodiment.

FIG. 8 is a block diagram illustrating a representation of an example of a data storage device 50 including a nonvolatile memory device according to an embodiment. The nonvolatile memory device 520 may be configured and operated in substantially the same manner as the nonvolatile memory devices (i.e., 200) of FIG. 1 or the nonvolatile memory devices (i.e., 400) of FIG. 6.

The data storage device 50 may be configured to store data provided from a host device (not illustrated) in response to a write request of the host device. The data storage device 50 may be configured to provide data stored therein to the host device in response to a read request of the host device. The host device is an electronic device capable of processing data, and may include a computer, a digital camera, or a mobile phone. The data storage device 50 may be embedded in the host device and operated. In an embodiment, the data storage device 50 may be separately fabricated and coupled to the host device.

The data storage device 50 may include a PCMCIA (Personal Computer Memory Card International Association) card, a CF (Compact Flash) card, a smart media card, a memory stick, various multimedia cards (MMC, eMMC, RS-MMC, MMC-micro), SD (Secure Digital) cards (SD, Mini-SD, and Micro-SD), UFS (Universal Flash Storage) or SSD (Solid State Drive).

The data storage device 50 may include a controller 510 and a nonvolatile memory device 520.

The controller 510 may control overall operations of the data storage device 50. The controller 510 may control a write or read operation of the nonvolatile memory device 520 in response to a write or read request of the host device. The controller 510 may generate a command for controlling the operation of the nonvolatile memory device 520, and provide the generated command to the nonvolatile memory device 520. The controller 510 may drive a software program for controlling the operation of the data storage device 50.

While various embodiments have been described above, it will be understood to those skilled in the art that the embodiments described are by way of example only. Accordingly, the nonvolatile memory device described herein should not be limited based on the described embodiments. Rather, the nonvolatile memory device described herein should only be limited in light of the claims that follow when taken in conjunction with the above description and accompanying drawings.

What is claimed is:

1. A nonvolatile memory device comprising:
   a plurality of memory blocks; and
   a controller configured to perform an erase operation by repeating an erase loop, and configured to generate and store a test result based on a pass erase loop count of the erase operation in response to a result processing command,
   wherein the erase loop includes applying an erase voltage to a target memory block among the memory blocks in response to an erase command,
   wherein the controller adjusts a start level of the erase voltage based on the test result in response to a start level setting command and applies the erase voltage having an adjusted start level to the target memory block at an initial erase loop,
   wherein the controller accumulates the pass erase loop count to a first value of a previously stored test result and stores the pass erase loop count as a second value of the test result when the pass erase loop count is less than a second value of the previously stored test result.

2. The nonvolatile memory device according to claim 1, wherein the controller sets a pass level corresponding to the pass erase loop count stored as the second value to the start level of the erase voltage, in response to the start level setting command.

3. The nonvolatile memory device according to claim 1, wherein the controller calculates a compensation level based on the first and second values and sets a level raised by the compensation level from a pass level corresponding to the second value to the start level of the erase voltage, in response to the start level setting command.

4. The nonvolatile memory device according to claim 1, wherein the controller raises a level of the erase voltage by a step level from a level applied at the immediately previous erase loop, whenever the erase loop is repeated.

5. The nonvolatile memory device according to claim 1, wherein the pass erase loop count indicates a minimum number of erase loops performed to completely erase the target memory block.

6. An operating method of a nonvolatile memory device, comprising:
   performing an erase operation by repeating an erase loop for a target memory block among a plurality of memory blocks, in response to an erase command;
   generating a test result based on a pass erase loop count of the erase operation, in response to a result processing command;
   adjusting a start level of an erase voltage applied to the target memory block based on the test result, in response to a start level setting command; and
   applying the erase voltage having an adjusted start level to the target memory block at an initial erase loop,
   wherein the generating of the test result comprises:
   accumulating the pass erase loop count to a first value of a previously stored test result; and
   storing the pass erase loop count as a second value of the test result when the pass erase loop count is less than a second value of the previously stored test result.

7. The operating method according to claim 6, wherein the performing of the erase operation comprises:
   applying an erase voltage to the target memory block;
   performing an erase verification operation on the target memory block; and
   raising a level of the erase voltage by a step level from a level of an erase voltage which was immediately previously applied, according to the verification result.

8. The operating method according to claim 6, wherein the setting of the start level comprises setting a pass level corresponding to the pass erase loop count stored as the second value to the start level.

9. The operating method according to claim 6, wherein the setting of the start level comprises:
   calculating a compensation level based on the first and second values; and
   setting a level raised by the compensation level from a pass level corresponding to the second value to the start level.

10. The operating method according to claim 6, wherein the pass erase loop count indicates a minimum number of erase loops performed to completely erase the target memory block.

11. A test system comprising:
a test device configured to generate an erase command, a result processing command and a start level setting command; and
a nonvolatile memory device,
wherein the nonvolatile memory device comprises:
a plurality of memory blocks; and
a controller configured to perform an erase operation by repeating an erase loop, and configured to generate and store a test result based on a pass erase loop count of the erase operation in response to the result processing command,
wherein the erase loop includes applying an erase voltage to a target memory block among the memory blocks in response to the erase command,
wherein the controller adjusts a start level of the erase voltage based on the test result in response to the start level setting command and applies the erase voltage having an adjusted start level to the target memory block at an initial erase loop,
wherein the controller accumulates the pass erase loop count to a first value of a previously stored test result and stores the pass erase loop count as a second value of the test result when the pass erase loop count is less than a second value of the previously stored test result.

12. The test system according to claim 11, wherein the test device generates the erase command and the result processing command for each of the memory blocks.

13. The test system according to claim 11, wherein the test device transmits the start level setting command to the nonvolatile memory device when all of the memory blocks are erased.

14. The test system according to claim 11, wherein when all of the memory blocks are erased, the test device reads the test result from the nonvolatile memory device, and adjusts the start level of the erase voltage based on the read test result.

15. The test system according to claim 11, wherein the controller raises a level of the erase voltage by a step level from a level applied at the immediately previous erase loop, whenever the erase loop is repeated.

16. The nonvolatile memory device according to claim 1, wherein the controller performs the initial erase loop during the erase operation by using an initial level set to the start level before adjusting the start level and performs the initial erase loop by using the adjusted start level after adjusting the start level.

17. The nonvolatile memory device according to claim 11, wherein the controller sets a pass level corresponding to the pass erase loop count stored as the second value to the start level of the erase voltage, in response to the start level setting command.

18. The nonvolatile memory device according to claim 11, wherein the controller calculates a compensation level based on the first and second values and sets a level raised by the compensation level from a pass level corresponding to the second value to the start level of the erase voltage, in response to the start level setting command.

* * * * *